United States Patent [19]

Drain et al.

[11] Patent Number: 5,305,601

[45] Date of Patent: Apr. 26, 1994

[54] SOLID FUEL ROCKET MOTOR ASSEMBLY, AND METHOD OF MAKING THE SAME

[75] Inventors: Kieran F. Drain, Rochester Hills, Mich.; Larry A. Nativi, Rocky Hill; Richard T. Thompson, Haddam, both of Conn.

[73] Assignee: Loctite Corporation, Hartford, Conn.

[21] Appl. No.: 929,651

[22] Filed: Aug. 12, 1992

Related U.S. Application Data

[60] Division of Ser. No. 651,078, Feb. 6, 1991, which is a continuation of Ser. No. 398,028, Aug. 24, 1989, abandoned, which is a division of Ser. No. 109,675, Oct. 16, 1987, Pat. No. 4,892,764, which is a continuation-in-part of Ser. No. 882,670, Jul. 7, 1986, abandoned, which is a continuation-in-part of Ser. No. 801,984, Nov. 26, 1985, abandoned.

[51] Int. Cl.$^5$ .............................................. F02K 9/00
[52] U.S. Cl. ................................... 60/255; 156/169; 427/515; 427/508
[58] Field of Search ................. 60/253, 255; 156/169, 156/173, 175, 273.3, 275.5, 330; 522/100, 101–102, 103, 111, 113, 170; 427/57

[56] References Cited

U.S. PATENT DOCUMENTS

| | | |
|---|---|---|
| 2,995,011 | 8/1961 | Kimmel .................................. 60/255 |
| 3,017,746 | 1/1962 | Kiphart ................................. 60/255 |
| 3,108,433 | 10/1963 | DeFries et al. ....................... 60/255 |
| 3,293,860 | 12/1966 | Stedfeld ................................ 60/253 |
| 3,303,079 | 2/1967 | Carter . |
| 3,316,842 | 5/1967 | Schulz ................................. 102/288 |
| 3,616,070 | 10/1971 | Lemelson . |
| 3,922,426 | 11/1975 | Feltzin . |
| 4,012,553 | 3/1977 | Clemens . |
| 4,092,443 | 5/1978 | Green . |
| 4,170,505 | 10/1979 | Zgraggen . |
| 4,239,077 | 12/1980 | Dixon et al. . |
| 4,252,593 | 2/1981 | Green . |
| 4,278,485 | 7/1981 | Hamm et al. . |
| 4,358,477 | 11/1982 | Noomen et al. . |
| 4,666,954 | 5/1987 | Forgo et al. . |
| 4,892,764 | 1/1990 | Drain et al. . |

FOREIGN PATENT DOCUMENTS 2421619 11/1975 Fed. Rep. of Germany .

OTHER PUBLICATIONS

"Filament & Winding", (C. 1970).
"Filament & Winding", J. F. Kober, 1985.
"Ultra Violet Curing Polyester Preimpregnated Materials for Vacuum Bag Laminates and Filament Winding", Horn. V. I., Novkov, R. L. Preprint of Report for the 21st Annual Meeting of the Reinforced Plastics Division of the Society of the Plastics Industry, Chicago, Ill.

*Primary Examiner*—Richard A. Bertsch
*Assistant Examiner*—Michael I. Kocharov
*Attorney, Agent, or Firm*—Steven J. Hultquist

[57] ABSTRACT

A fiber/resin composite whose resin phase is formed by at least initial actinic radiation curing of a resin composition comprising an actinic radiation curable first resin component and a second resin component which is non-cured under curing conditions effective for the first resin component. The actinic radiation exposure of the fiber/resin composition effects curing of the first resin component to immobilize the composite and impart structural integrity thereto, whereby the composite may be handled, packaged, or further processed. Filament wound, braided, and pultruded articles are described, together with associated methods for forming such articles by filament winding, braiding and pultrusion. As a specific embodiment, a solid fuel rocket motor is disclosed comprising a solid fuel body in a filament wound fiber-resin composite casing formed by filament winding of the solid fuel body with resin-impregnated filament or rovings thereof.

11 Claims, 2 Drawing Sheets

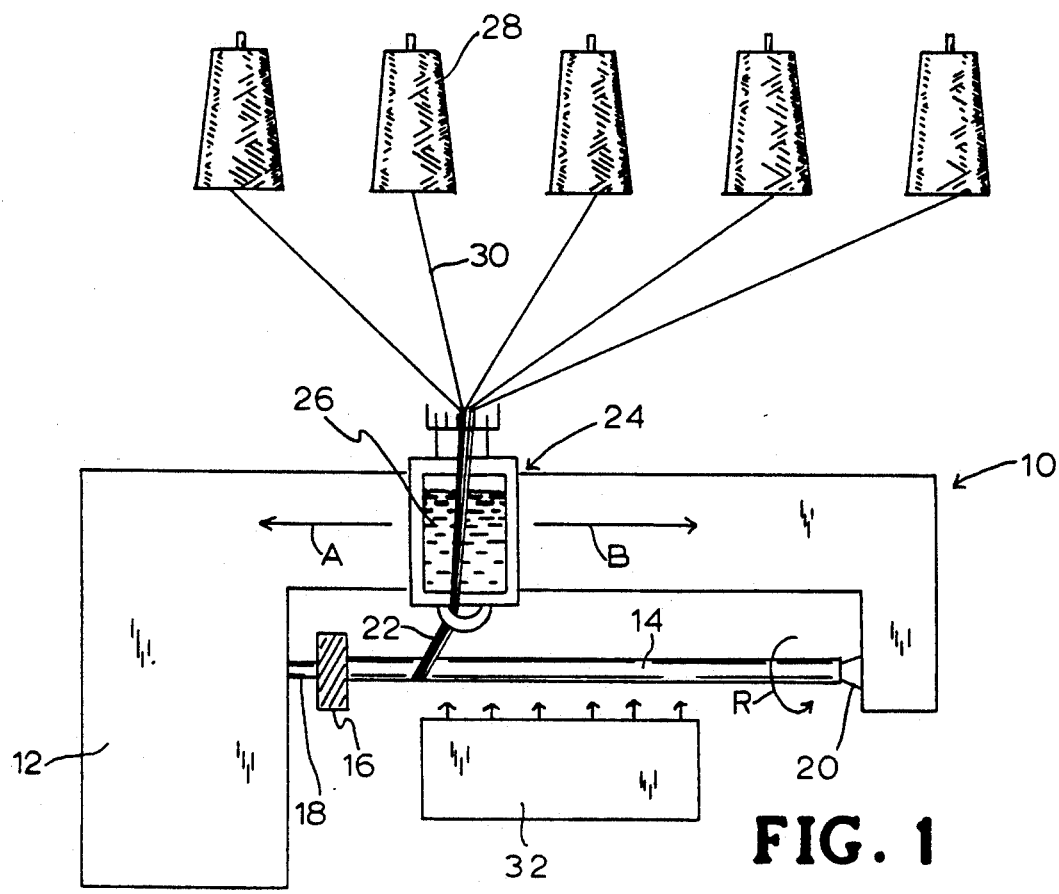
FIG. 1
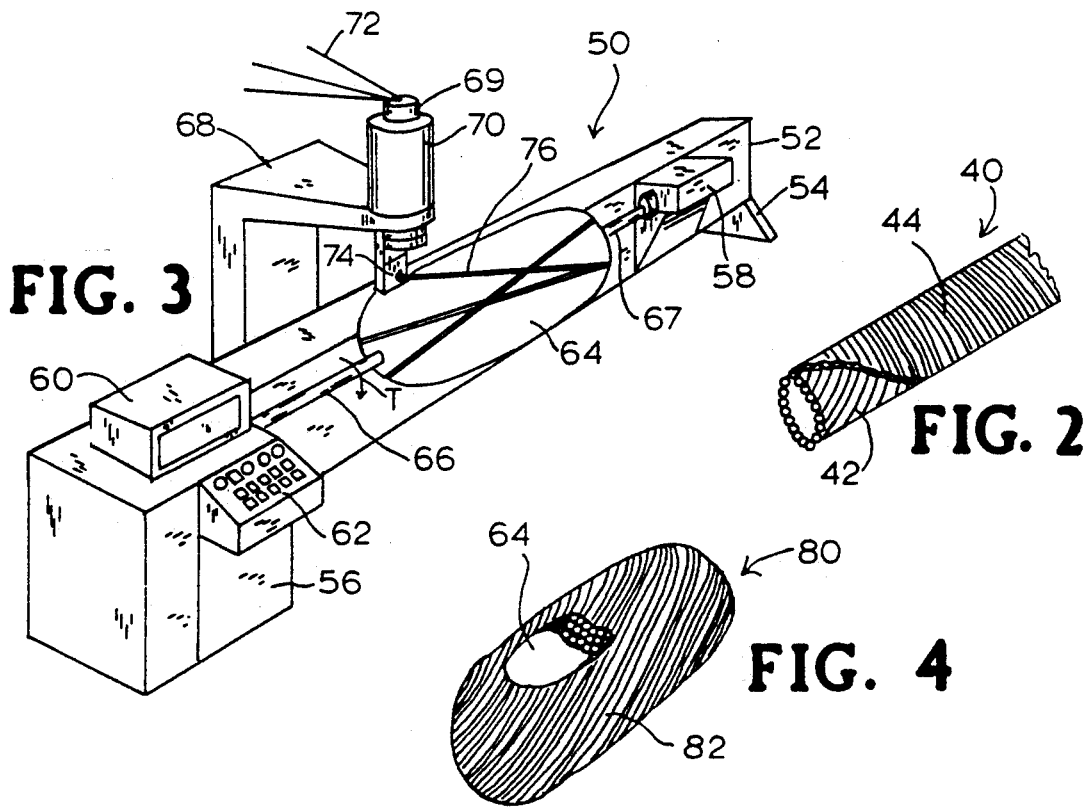
FIG. 3
FIG. 2
FIG. 4

SOLID FUEL ROCKET MOTOR ASSEMBLY, AND METHOD OF MAKING THE SAME

CROSS-REFERENCE TO RELATED APPLICATIONS

This is a division of U.S. application Ser. No. 07/651,078 filed 6 February 1991, which is a continuation of U.S. application Ser. No. 07/398,028 filed 24 August 1989, now abandoned which is a division of U.S application Ser. No. 07/109,675 filed 16 October 1987 and issued 9 January 1990 as U.S. Pat. No. 4,892,764, which in turn is a continuation-in-part of U.S. application Ser. No. 07/882,670 filed 7 July 1986 and now abandoned, which in turn is a continuation-in-part of U.S. application Ser. No. 07/801,984 filed 26 November 1985, now abandoned.

BACKGROUND OF THE INVENTION

1. Field of the Invention

The present invention relates generally to fiber/resin composites and a method of making same. In a specific aspect, the present invention relates to articles comprising filament arrays of parallelly aligned, laterally continuous filaments, such as are formed by filament winding, braiding, and pultrusion processes.

2. Description of the Related Art

In the field of composite materials, a variety of fabrication methods and techniques have come into usage for producing fiber-reinforced resin matrix materials.

These include prepreg manufacture, lay-up techniques, sheet molding of chopped fiber laminates, resin transfer molding, and reinforced reaction injection molding, all of which involve the fabrication of fiber-reinforced resin materials using short fibers.

Continuous filament processes also have evolved which are adapted to automated production of filament-reinforced resin articles. The continuous fiber processes include filament winding, wherein the filament in the form of discrete strands or roving is coated with a resin then wound on a mandrel at a predetermined angular orientation and winding thickness to yield articles having high strength when the resin borne on the filament is cured. Another continuous filament process is braiding, in which a plurality, e.g., as many as 144 separate fiber tows are interwoven to form tubular products. Continuous filaments may also be employed in pultrusion processes, wherein a plurality of filament strands or rovings are passed under tension through a resin bath to apply a resin coating thereto, following which the filament is drawn through a preformer, or initial forming die, which imparts a selected cross-sectional shape to the fiber array. The initially shaped fiber array is next passed through a heated die with constant cross-sectional area, by which the resin is cured, with the resulting rigid formed article being withdrawn and conveyed to a cut-off saw or other severing apparatus to form discrete product articles. The pultrusion process is conducted under continuous tension, by means of a puller or other drawing means which pulls the filament through the constituent unit step in the process systems.

A wide variety of composite product articles are formable by continuous filament processes such as filament winding, braiding, and pultrusion methods, including golf clubs, tennis rackets, pressure vessels, fishing rods, gas tanks, drive shafts, aerospace control linkages, sliding bearings, helicopter rotars, pipes, tubes, solid rods, missile launchers, artillery, bazookas, gun barrels, and various other structural members and component parts utilized in the aerospace, automotive, appliance, and consumer product industries.

Considering filament winding in grater detail, the mandrel which is employed either may be reusable in character or it may be employed as a constituent part of the article to be formed (the mandrel being removable with the product article from the forming machinery in the latter case). Alternatively, the mandrel may be of a temporary character, providing a winding substrate during the filament winding operation, but being subsequently removed by dissolution or decomposition to provide an interior cavity in the filament wound article. Temporary mandrels may be formed for example of eutectic salts, plastics, mixtures of sand and polyvinyl chloride, etc., for such purpose.

The resins which are employed in filament winding, braiding, and pultrusion operations must exhibit constant viscosity and long pot life in the process systems in which they are employed. Constant viscosity is required in order that coating of the resin on the continuous filament is highly uniform in character, as required to achieve substantially uniform, e.g., isotropic, properties in the final product article.

If viscosity changes appreciable during the filament winding, braiding, or pultrusion operation, the applied resin thickness may change significantly, and such thickness change may in turn result in (i) localized stresses or discontinuities in the final product article, (ii) product articles which are not within required dimensional tolerance specifications, and (iii) inadequate curing of the resin. In addition, the tensional forces on the resin impregnated filaments being processed will significantly increase with increases in the resin viscosity, to such extent that the filament becomes highly susceptible to snapping, i.e., tensionally breaking.

Long pot life of the resin is necessary, particularly in filament winding and braiding, where processing times may be on the order of hours. Since the resin is continuously being applied to the filament in these processes, the resin bath or other source of the resin must be continually replenished with resin coating material, and it is therefore necessary that the resin not "set up" or gel in the source bath or other source container and applicating means.

The standard resins which have been employed in the above-described continuous filament processes, as well as in fiber/resin composites manufacture generally, are one-part heat curing epoxy resins, or two-part ambient temperature cure or heat cure epoxies. These thermal cure and ambient cure resins have associated deficiencies which have specifically limited the utility of filament winding, braiding and pultrusion processes, and are also frequently disadvantageous in other fiber/resin composite manufacturing operations.

In filament winding applications, the mandrels employed may be of materials which are adversely affected by heat so that thermal curing resins cannot be usefully employed. An example is the fabrication of rocket motors in which resin-bearing filament is wound onto a solid rocket fuel body. In such applications, ambient cure resins must be employed. However, since the filament winding operation may take upwards of 6 hours and since viscosity cannot vary during this period, a long pot life ambient cure resin is essential, and consequently the filament wound body must be rotated until full cure of the ambient cure resin is achieved, which in the case of epoxy resins conventionally employed is upwards of 4 days. Continuous rotation of the mandrel and filament winding is essential in such case, since cessation of rotation would result in the viscous resin sagging under gravitational forces, resulting in a resin-rich lower portion of the product article and a resin-poor upper portion of same.

Similar problems of resin sag and long ambient cure times frequently arise in filament braiding operations.

In pultrusion processes, ambient cure resins are typically not advantageous due to the large volume of storage space which would be required during curing of the pultruded article under ambient, e.g., room temperature, conditions. Accordingly, it has been common practice to utilize thermally cured resins in the pultrusion process which are cured concurrently with the passage of the fiber array through the forming die, typically by a heated die or a heater associated therewith.

Nonetheless, such use of thermally cured resins in the pultrusion process is disadvantageous when solvent-based thermally curable resin formulations are employed, since the linear speed of the drawn fibers needs to be fairly high in order to achieve economy in the continuous filament processing operation. Accordingly, it is desirable to cure the formed fiber array very quickly, by the imposition of suitably high temperature. This in turn raises the problem that a high localized heating intensity imposed on the formed filament array may result in rapid loss of the solvent as well as other volatile components in the resin, causing pinholes, blisters, and other localized discontinuities in the applied coating which adversely affect the strength, impact resistance, and other physical properties, as well as the aesthetic characteristics of the product article. Typically, linear speeds of the drawn filaments in conventional commercial pultrusion processes are on the order of from about 0.5 to 2 feet per minute, to accommodate an elevated temperature curing step of approximately 10 minutes (retention time in the heated die/curing oven).

Accordingly, it would be a significant advance in the art to overcome the above-described difficulties associated with the filament winding, braiding, and pultrusion processes, in a manner which as specifically applied to filament winding of heat-sensitive cores or mandrel members would obviate the use of long rotation periods heretofore necessary for curing of ambient cure resins, which in filament braiding operations reduces the problem of resin sag and extended curing times, and which in specific application to pultrusion processes, permits the processing rate in the process system to be measurably increased.

Accordingly, it is an object of the present invention to provide an improved process for forming fiber/resin composites.

It is a further object of the invention to provide an improved process for filament winding, braiding and pultrusion, which overcomes the above-described deficiencies of the prior art practice of these processes.

It is another object of the invention to provide filament wound, braided, and pultruded articles which are readily and economically formed, and which are rapidly processed for subsequent handling, packaging, or other processing operations.

Other objects and advantages of the present invention will be more fully apparent from the ensuing disclosure and appended claims.

SUMMARY OF THE INVENTION

In one aspect, the present invention relates to a fiber/resin composite comprising a resin having fiber(s) associated therewith, said resin comprising an actinic radiation-curable first resin component and a second resin component which is non-cured under actinic radiation conditions curingly effective for the first resin component, wherein the actinic radiation curable component is present in an immobilizingly effective amount for the composition prior to curing of the second resin component, and wherein the resin composition has been exposed to actinic radiation curingly effective for the first resin component prior to curing of the second resin component.

In another aspect, the present invention relates to an article comprising a filament array of parallelly aligned, laterally continuous filaments impregnated with an actinic radiation-curable first resin component and a second resin component which is non-cured under actinic radiation conditions curingly effective for the first resin component, wherein the actinic radiation-curable first resin component is present in an immobilizingly effective amount for the composition and filament array prior to curing of the second resin component, and wherein the resin composition has been subjected to actinic radiation curingly effective for the first resin component prior to curing of the second resin component.

In additional specific aspects, the above-described article may comprise a filament wound article comprising a core body in a fiber-resin composite casing formed by filament winding the core body with filament impregnated with a multiple stage curing resin comprising the actinic radiation-curable first resin component. Alternatively, the article may comprise a pultruded body formed by protruding an array of parallelly aligned filaments through a die imparting a selected cross-sectional shape thereto, wherein the filaments are impregnated with the multiple stage curing resin comprising the actinic radiation-curable first resin component.

In a further specific aspect, the invention relates to a solid fuel rocket motor, comprising a solid fuel body in a filament-wound fiber-resin composite casing, the casing being formed by a filament winding of filament impregnated with a resin composition comprising an actinic radiation-curable first resin component and an ambient cured second resin component, wherein the actinic radiation-curable component is present in an immobilizingly effective amount for the composition prior to ambient curing of the second resin component, and wherein the resin composition has been subjected to actinic radiation curingly effective for the first resin component prior to ambient curing of the second resin component.

In the various articles described hereinabove, the actinic radiation curable first resin component may for example be selected from one or more resins of the group consisting of (meth)acrylic resins, vinyl monomers, unsaturated polyesters solubilized in vinyl monomers, and epoxy resins, and the second resin component may for example comprise an ambient cured resins elected from one or more resins of the group consisting of epoxy resins, silicones, and urethanes.

In another aspect, the invention relates to a method of making a fiber/resin composite, comprising the steps of:

(a) providing a resin composition comprising an actinic radiation-curable first resin component and a second resin component which is non-cured under actinic radiation conditions curingly effective for the first resin component, the first resin component being present in an amount which is immolizingly effective for the composition upon its exposure to actinic radiation curingly effective for the first resin component;

(b) combining said resin composition with one or more fibers to yield a fiber/resin composition matrix;

(c) forming the fiber/resin composition matrix into a selected shape; and (d) exposing the shaped, fiber/resin composition matrix to actinic radiation which is curingly effective for the first resin component, thereby immobilizing the resin composition and the resulting fiber/resin composite.

Another aspect of the invention relates to a method of making a filament wound article, comprising the steps of:

(a) rotating a mandrel about its longitudinal axis;

(b) impregnating a winding filament with a resin composition comprising an actinic radiation-cured first resin component and a curable second resin component;

(c) filament winding the mandrel during said rotation thereof, in successive circumferential turns whereby adjacent turns are substantially contiguous to one another;

(d) contemporaneous with the rotation and filament winding, exposing the wound filament to actinic radiation which is curingly effective for the actinic radiation curable first resin component and immobilizes the resin composition in the applied windings so that migrative movement of the resin composition is precluded;

(e) terminating the rotation of the mandrel; and (f) curing the second resin component of the resin composition under conditions curingly effective therefor, to yield the mandrel encased in a filament-wound casing.

The foregoing method of making a filament wound article is applicable to the filament winding of a solid fuel rocket motor body wherein the second resin component is non-thermally curable and in which the solid fuel body is preferably of cylindrical shape.

Still another aspect of the invention relates to a method of forming a filament wound article including a core body in a fiber-resin composite casing, comprising filament winding the core body with a filament impregnated with an actinic radiation-curable first resin component and a second non-thermally curable second resin component, and contemporaneous with the winding, exposing the wound filament, or the filament about to be wound, to actinic radiation which is curingly effective to cure the first resin component, and subsequently curing the second resin component.

A still further aspect of the invention relates to a method of forming a pultruded article comprising impregnating the filaments to be pultruded with a resin composition comprising an actinic radiation curable first resin component and a curable second resin component, pultruding an array of parallelly aligned filaments having said resin composition impregnated thereon through a die imparting a selected cross-sectional shape thereto, wherein the shaped filament array concurrently with its passage through the die is subjected to actinic radiation which is curingly effective for the actinic radiation curable first resin component, thereby imparting sufficient structural integrity to the pultruded article to permit its handling, packaging, and/or further processing, prior to or concurrently with curing of the second resin component of the composition.

Other aspects and features of the invention will be more fully apparent from the ensuing disclosure and appended claims.

BRIEF DESCRIPTION OF THE DRAWINGS

FIG. 1 is a simplified schematic depiction of a filament winding system for carrying out the filament winding process of the present invention according to one embodiment thereof.

FIG. 2 is a perspective view of a portion of a filament wound article produced by the filament winding system shown in FIG. 1.

FIG. 3 is a perspective view of a filament winding system for filament winding a solid fuel rocket motor body, to encase same in a filament wound sheath.

FIG. 4 is a perspective view of the filament wound solid fuel rocket motor formed on the filament winding apparatus shown in FIG. 3, and broken away to show the constituent fuel body utilized in FIG. 3 as the mandrel for the solid fuel rocket motor.

DETAILED DESCRIPTION OF THE INVENTION, AND PREFERRED EMBODIMENTS THEREOF

Figure 5:
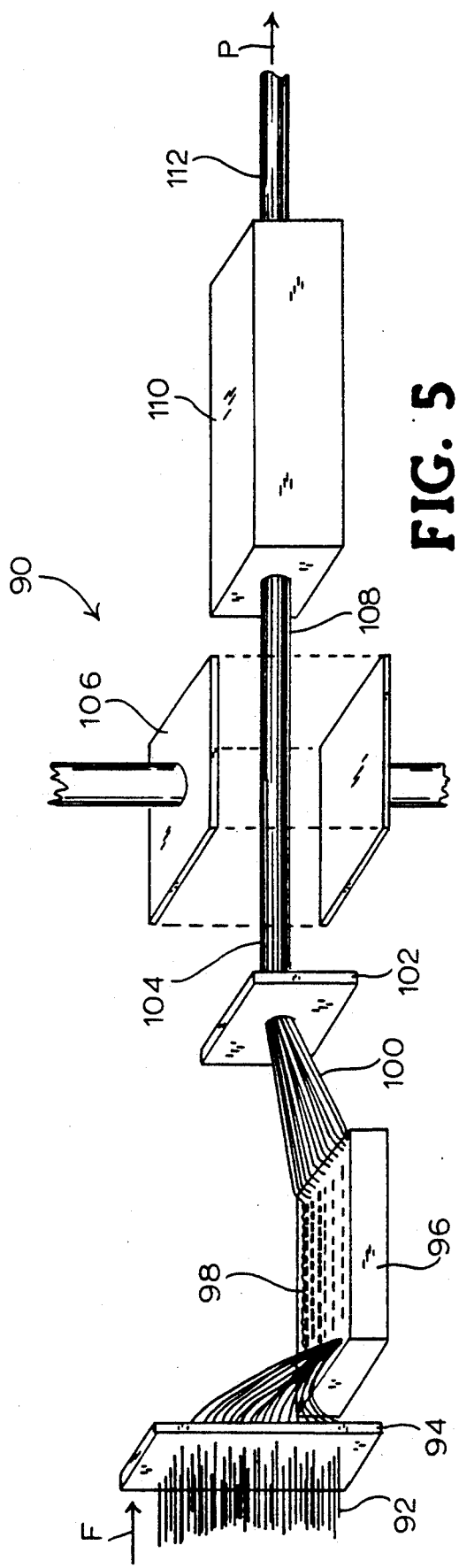
FIG. 5 is a perspective simplified schematic depiction of a pultrusion process system for carrying out a pultrusion process according to the present invention, in one embodiment thereof.
Figure 6:
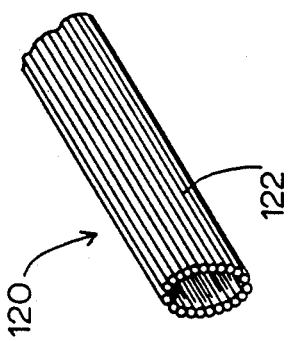
FIG. 6 is a perspective view of a portion of a pultruded article formed by the pultrusion system shown in FIG. 5.

The disclosures of U.S. application Ser. No. 104,885 filed Aug. 19, 1987, U.S. application Ser. No. 882,670 filed Jul. 7, 1986, and U.S. application Ser. No. 801,984 filed Nov. 26, 1985, are hereby incorporated by reference herein.

The resin composition utilized in the present invention comprises an actinic radiation curable first resin component and a second resin component which is subsequently cured after actinic radiation exposure curing of the first resin component and thus is non-cured under actinic radiation conditions effective for curing the first resin component.

The first resin component may comprise any suitable resin which under actinic radiation conditions may be cured to such extent as to immobilize the resulting partially cured mass of the composition comprising the first and second resin components, i.e., spatially fix the location of the partially cured composition mass so that it does not migrate during the subsequent cure of the second resin component.

Suitable first resin components of the composition may include (meth)acrylic resins, vinyl monomers, unsaturated polyesters solubilized in vinyl monomers, and epoxy resins.

As used herein, the term "(meth)acrylic" is intended to be broadly construed to include acrylic as well as methacrylic compounds, e.g., acrylic esters and methacrylic esters.

Useful acrylic resins include esters and amides of (meth)acrylic acid as well as comonomers thereof with other copolymerizable monomers. Illustrative esters include methyl acrylate, methyl methacrylate, hydroxy ethyl acrylate, butyl methacrylate, octyl acrylate, and 2-epoxy ethyl acrylate. Illustrative amides include butoxymethyl acrylamide, methoacrylamide, and tertbutyl acrylamide. Also suitable are copolymers of such compounds, and copolymer with other monomers containing polymerizable vinyl groups. Polyacrylates are generally useful, including 1,3-butylene glycol diacrylate, diethylene glycol diacrylate, 1,6-hexanediol diacrylate, neopentyl glycol diacrylate, polyethylene glycol diacrylate, tetraethylene glycol diacrylate, triethylene glycol diacrylate, pentaerythritol tetraacrylate, tripropylene glycol diacrylate, ethoxylated bisphenol-A-diacrylate, trimethylolpropane triacrylate, di-trimethylolpropane tetraacrylate, dipentaerythritol pentaacrylate, pentaerylthritol triacrylate, and the corresponding methacrylate compounds. Also useful are reaction products of (meth)acrylic acid and epoxide resins, and urethane resins. Suitable poly(meth)acrylate ester compounds are also described in U.S. Pat. Nos. 4,051,195; 2,895,950; 3,218,305; and 3,425,988.

It will be understood that the foregoing listing of (meth)acrylic compounds is intended only to be illustrative in character, and that any other resin compounds having (meth)acrylic functionality in their molecules and curable under actinic radiation conditions may be potentially employed.

Among the foregoing compounds, (meth)acrylic acid esters are preferred, with the most preferred compounds being (meth)acrylic acid esters of polyhydric alcohols, such as ethoxylated trimethylolopropane triacrylate and dipentaerythritol monogrydoxy pentaacrylate.

Another class of resins which are actinic radiation curable and potentially suitable for use in the compositions in the invention include vinyl monomers such as styrene, vinyl toluene, vinyl pyrrolidone, vinyl acetate, divinyl benzene, and the like.

A further class of actinic radiation curable first resin component materials comprises unsaturated polyesters, solubilized in vinyl monomers, as ordinarily prepared from alpha-beta ethylenically unsaturated polycarboxylic acids and polyhydric alcohols, as described for example in U.S. Pat. No. 4,025,407.

Yet another class of actinic radiation curable first resin component materials comprises UV curable epoxy resins, including cycloaliphatic epoxides such as limonene dioxide, limonene oxide, alpha pinene oxide, aliphatic epoxides such as butyl diglycidyl ether, and neopentyl glycol diglycidyl ether, as illustratively disclosed in U.S. Pat. No. 4,412,048.

As used herein, "actinic radiation" means electromagnetic radiation having a wavelength of about 700 nm or less which is capable, directly or indirectly, of curing the specified resin component of the resin composition. By indirect curing in this context is meant curing under such electromagnetic radiation conditions, as initiated promoted, or otherwise mediated by another compound.

Although it is an essential requirement of the invention that the first resin component be actinic radiation curable, the second resin component may or may not be so curable, depending on the cure and resin composition desired; if both first and second resins are actinic radiation curable, however, it is further required that the second resin component be non-cured under actinic radiation conditions which are effective for curing the first resin component.

Accordingly, photo initiators may be added to the composition in an amount effective to respond to the actinic radiation and to initiate and induce curing of the associated resin, via substantial polymerization thereof.

Suitable photoinitiators useful with ultraviolet (UV) actinic radiation curing of (meth)acrylic and vinyl monomers include free radical generating UV initiators such as benzopheneone, diethoxy-acetophenone, benzoin methyl ether, benzoin ethyl ether, benxoin isopropyl ether, diethoxyxanthone, chloro-thio-xanthone, azo-bis-isobutyronitrile, N-methyl diethanol-amine-benzophenone, and mixtures thereof.

Visible light initiators include camphoroquinone/-peroxyester initiators and 9-fluorene carboxylic acid peroxyesters.

Infrared initiators include cumeme hydroperoxide, benzoyl peroxide, asobisisobutyronitrile, and also azo and peroxide compounds.

If the actinic radiation curable first resin component is an epoxy resin, the photoinitiator may be a UV initiator which in the presence of UV light, liberates a Lewis acid and/or Bronsted acid, such as iodonium salts, sulfonium salts, arsonium salts, and diazonium salts.

The amount of the photoinitiator required for a given composition may be readily determined by the expedient of simple experiment, without undue effort. In general, however, in the case of (meth)acrylic and vinyl first resin components, amounts of photoinitiator on the order of about 0.1–10 percent by weight, and preferably about 0.5–5 percent by weight, based on the weight of the resin component, have been found satisfactory. In the case of UV curable epoxies, the Lewis acid/-Bronsted acid-releasing initiator may generally be present in the composition at a concentration of about 1–5 percent by weight, based on the weight of the epoxy resin.

The second resin component of the resin composition may be any suitable resin which is compatible with the composition comprising the first resin component and which, as indicated, is non-cured under the actinic radiation conditions which are curingly effective for the first resin component.

The second resin component thus may be curable under any suitable curing conditions, including, but not limited to, one or more compatible conditions of the group consisting of: (a) moisture exposure, (b) ambient temperature, (c) elevated temperature, (d) reaction with curative species, (e) in situ formation of curative species, and (f) actinic radiation exposure differing from the actinic radiation exposure which is curingly effective for the first resin component.

Illustrative of second resin component materials are epoxy resins, silicones, and urethanes.

Epoxy resins potentially suitable for use as the second resin component of the resin composition include those materials having at least one polymerizable epoxy group per molecule, and preferably two or more such groups per molecule. Suitable epoxy resins include those derived from epichlorohydrin and dihydric phenols, e.g., resorcinol, hydroquinone, bisphenol, A, p-p'-dihydroxybenzophenone, p-p'-dihydroxydiphenyl, p-p'-dihydroxydiphenyl ethane, bis (2-hydroxynaphthyl) ethane, and 1,5-dihydroxynaphthalene, with bisphenol A being preferred. The epoxy compounds may be a cycloalphatic epoxy, an epoxidized novalak, or a digylcidyl ether of bisphenol A (DGEBA), as described in "Handbook of Epoxy Resins" by Lee and Neville, McGraw-Hill Book Co., New York (1967).

In lieu of the above-described epoxy functional polymerizable monomers, or alternatively in association therewith, various epoxidized rubbers may be utilized in the resin compositions of the invention as the second resin component, such materials being well known in the art.

A useful class of such epoxidized rubbers are epoxidized carboxy terminated butadiene acryloitrile copolymers sold under the name of Kelpoxy by Spencer Kellogg, and epoxidized polybutadiene, for example Oxiron 2001 commercially available from FMC Corporation. Still other suitable rubber epoxy additives are the various polymers sold by B. F. Goodrich Company under the name HYCAR.

Epoxies are preferred second resin components in the resin compositions employed in the invention, for the reason that a wide variety of curvatures and curing conditions may be employed to cure various epoxy resins.

Epoxy resins useful as the second resin component in the invention may include heat-cured epoxy resins, in applications where the core or associated parts of the fiber-comprising article are not heat-sensitive. Accordingly, conventional heat-activated epoxy curatives, of a type well known in the art, may be employed. Such curatives are, for example, described in "Epoxy Resins, Chemistry and Technology," May and Tanaka, Marcel Dekker, Inc., New York (1973), hereby incorporated by reference, and may include: (i) Lewis acid (cationic) catalysts, such as boron trifluoride amine complexes, e.g., boron trifluoride monoethyl amine, as well as the metal halides of tin, aluminum, zinc, boron, silicon, iron, titanium, magnesium, and antimony, and the like;

(ii) acid anhydrides, such as hexahydrophthalic anhydride, tetrahydrophthalic anhydride, methyl anhydride, dodecenyl succinic anhydride, and the like;

(iii) imidazoles, such as derivatives of 2-phenyl imidazole, and derivatives of 1-cyanoethyl-2-phenylimidazole, and the like;

(iv) dicyandiamide, optionally in combination with accelerators such as phenyl methyl urea or piperidine;

(v) latent amine curatives, such as the modified polyamide disclosed in U.S. Pat. No. 4,459,398 and available from Ciba Geigy as Hardener HT939;

(vi) amines per se, e.g., primary amines such as polypropyleneamine, tertiary amines such as pyridine, 2,4,6-tris(dimethylaminoethyl)phenol, benzylidimethylamine, and triethylamine, and secondary amines such as piperidone, diethanolamine, and the like; and (vii) dissociable amine salts, such as the tri(2-ethylhexanoate) salt of tris(dimethylaminomethyl)phenol, and the like.

Another class of potential second resin component materials includes silicones such as RTV silicones, e.g., oxime polysiloxane materials. Such silicones may suitably be moisture cured in a conventional known manner.

A further class of potential second resin component materials includes polyurethane resins, including thermosetting as well as moisture-curable polyurethane resins formed as condensation products of polyisocyanates and active hydrogen-containing compounds. The active hydrogen compounds may for example by polyesters prepared from polycarboxylic acids and polyhydric alcohols, polyhydric polyalkylene ethers having at least two hydroxy groups, polythioether glycols, polyester amides, etc.

The foregoing classes of potential second resin component material are illustrative in character, it being understood that any other resin materials which are compatible with the resin composition comprising the first resin component and efficacious for the resin usage of the composition may advantageously be employed.

Other resins which may be usefully employed as second resin components, depending on the identity of the first resin component and the desired characteristics of the resin composition, include alkyd resins, acrylic resins, and aminoplast resins.

A highly useful thermally cured second resin component which may be advantageously employed in resin compositions in accordance with the invention is a cycloaliphatic epoxy resin which is cured at elevated temperature in the presence of an acid anhydride curative.

The specific relative proportions of the respective first and second resin components in the resin composition as necessary or appropriate for a given application may be readily determined by simple experiment to determine if the particular ratio chosen meets the resin composition criteria of the invention, viz., the proportions and cures of the first and second resin components must be such that the actinic radiation curing of the first resin component immobilizes the resulting partially cured mass of the composition, and maintains such immobilization throughout the subsequent curing of the second resin.

These criteria may readily be assessed empirically by sample physical property determinations, visual inspection, etc., without undue experimentation by one of ordinary skill in the art.

In the broad practice of the invention, the concentration of the first resin component may suitably be on the order of from about 1 to about 50 percent by weight, based on the total weight of the first and second resin components in the resin composition. If the first resin component is present at concentrations below about 1 percent, there is generally insufficient immobilization of the resin composition, so that it is susceptible to migration, until the second resin component is cured. If, on the other hand, the concentration of the first resin component is above about 50 percent, there tends in many cases to be insufficient second resin component present to provide the desired ultimate physical and performance properties in the finally cured resin composition.

Based on the foregoing considerations, highly desirable resin compositions according to the invention may employ the first resin component at a concentration of from about 1 to about 30 percent by weight, based on the total weight of the first and second resin components in the composition.

Preferred concentrations of the first resin component in the resin composition, particularly when the first resin component is a (meth)acrylic resin and the second resin component is an epoxy resin, are from about 5 to about 20 percent by weight, and most preferably from about 5 to about 10 percent by weight, based on the total weight of the first and second resin components.

The resin compositions of the invention may suitably contain any further components necessary or desirable for the specific intended end use and curing schedule. Examples include stabilizers, antioxidants, pigments, fillers, surfactants, tackifiers, adhesion promoters, etc.

It will be appreciated that it may be desirable in some instances to deploy more than two resin components in the resin composition employed in the composite, e.g., applied to the filaments in continuous filament applications, each of which is in turn successively cured, and that such polymodal cure compositions are within the purview of the present invention.

The thickness of the resin composition with which the filaments are impregnated, i.e., coated, will depend on a number of variables, including the character of the composition, the nature of the intended use environment, the substrate filaments, etc. In general, however, for filament wound, braided, and pultruded articles, the thickness of the fully cured resin composition, as measured between closely adjacent filaments in the product article, will be on the order of from about 2 to 40 mils, and preferably from about 5 to about 25 mils.

Product articles according to the present invention may be made by any of a wide variety of fiber/resin composite forming methods, including those utilized in forming fiber/resin matrices comprising discontinuous fibers, such as lay-up techniques, sheet molding, resin transfer molding, etc., as well as methods applicable to the use of continuous filament, such as filament winding, braiding, and pultrusion. Further, fiber/resin composite articles may be formed by a combination of these methods, such as where a solid rod is formed by pultrusion and subsequently used as the core body for filament winding.

In one preferred aspect, the articles produced according to the invention may comprise a filament array of parallelly aligned, laterally continuous filaments which have been impregnated with the resin compositions of the invention and subjected to actinic radiation curingly effective for the actinic radiation curable first resin component of the composition. Such actinic radiation curing structurally rigidifies the product article so that it is self-supporting in character and possessed of a sufficient degree of structural integrity to permit it to be handled, packaged, or otherwise further processed. This is a significant advantage in instances where the actinic radiation cured filament article is packaged and subsequently cured in situ via ambient curing of a suitable second resin component, e.g., an ambient curing epoxy or silicone resin.

As used herein, the term "laterally continuous" when used to describe filament arrays of parallelly aligned filaments, means that the adjacent filaments in the parallelly aligned array have the resin composition between their facing surfaces, without gross voids, spaces, or discontinuities therebetween.

In filament winding to produce filament wound articles according to the present invention, wherein the filaments are impregnated with the resin composition comprising the actinic radiation curable first resin component and a second resin component which is cured under curing conditions other than those effective for the first resin component, the actinic radiation may be applied to the filament prior to, simultaneously with, or subsequent to winding of the filament onto the substrate mandrel. Such concurrent actinic irradiation of the resin borne on the filament facilities a high degree of processing flexibility in the fabrication of such filament wound product articles. Articles of substantial irregular shape can be wound because irradiating impregnated fibers prior to substrate contact can impart sufficient adhesive and tack qualities to cause the fiber to adhere to the substrate while passing over areas where slippage would normally occur.

Thus, in some instances, it may be advantageous to irradiate the impregnated filament prior to its application by winding onto the substrate, so that the resin composition is cured with respect to its first resin component, or alternatively it may be desirable to filament wind the mandrel, and subsequently to irradiate the wound article.

Similarly, in the pultrusion formation of filament articles according to the present invention, an array of parallelly aligned filaments is pultruded through a die imparting a selected cross-sectional shape thereto, the filament having been impregnated with the resin composition of the invention. The resulting shaped filament array concurrently with its passage through the die is subjected to actinic radiation curingly effective for the first resin component in the resin composition. Such concurrent irradiation may be effected either prior to or subsequent to passage of the filament array through the die, it being recognized that the ultimate shape is imparted somewhat upstream of the die in proximity to the forming die openings. In a specific application, the particular placement and operation of the actinic radiation source for effecting curing of the first resin component will be readily determinable by those skilled in the art without undue experimentation.

Considering again the filament winding process of the invention, the same may be practiced with a mandrel which is either temporary, i.e., not forming a constituent part of the product filament wound article, or permanent as a constituent part of the product article. In the former case, the mandrel may be only temporarily associated with the filament wound casing applied thereto, being permanently associated with a filament winding machine. For example, the mandrel may be of metal construction having a highly polished surface, e.g., stainless steel with a mirror finish imparted thereto and coated with a release coating, e.g., a silicone film, prior to filament winding, whereby upon completion of the filament winding and actinic radiation curing of the first resin component, the filament wound casing is removed after the mandrel is detached from the filament winding machine.

Alternatively, temporary mandrels, of a type formed of soluble or decomposable materials may be advantageously employed. Examples include eutectic salts removable by solvent leaching; thermoplastics, which may be thermally degraded or melted; and mixtures of sand and polyvinyl chloride which may be readily decomposed.

Where the mandrel is permanent as a constituent part of the product filament wound article, the mandrel, as the core body of the ultimate product article, is rotated and filament winding is carried out with filaments bearing the curable resin compositions of the invention.

A particularly advantageous application of the filament winding process of the invention is in the manufacture of solid fuel rocket motors including a solid fuel body, preferably of substantially cylindrical shape. In such application, the filament winding applied to the solid fuel body is cured under actinic radiation to impart structural rigidity and handleability to the rocket motor assembly, so that the problems incident to the prior art requirement of rotating the rocket fuel body until complete cure of an ambient temperature curing resin is achieved, are fully obviated by the present invention. The second resin component in such application may suitably comprise a room-temperature curing epoxy resin, but since the same is effectively immobilized by actinic radiation curing of the first resin component, the filament wound article may be handled, packaged, or further processed without loss of structural integrity or the occurrence of resin sag. Accordingly, such application of forming solid fuel rocket motors represents a substantial advance in the art, as regards the time, expense, and complexity of forming such rocket motors by the methods of the prior art.

Referring now to the drawings, FIG. 1 is a simplified schematic depiction of a filament winding process system according to the present invention, in one embodiment thereof.

The filament winding process system 10 comprises a frame 12 on which is mounted a reciprocating carriage 24, adapted for reciprocating movement (by means now shown) in the respective directions indicated by the arrows A and B.

The reciprocating carriage in turn comprises a resin bath 26 in which is disposed a selected volume of the resin composition of the present invention, comprising an actinic radiation curable first resin component, and a second resin component which is non-cured under conditions curingly effective for the first resin component. The resin bath receives filaments 30 from a series of roving creels 28.

The frame features a spindle 20 on which one end of a mandrel 14 may be mounted for rotation in the direction of the arrow R, with the other end of the mandrel being secured by chuck 16 and driven by drive shaft 18 operatively connected to suitable drive means (not shown) in the frame 12.

Disposed beneath the mandrel is an ultraviolet radiation source 32, which is constructed and arranged to direct actinic radiation of appropriate wavelength onto the resin-impregnated roving filaments 22 which are wound on the mandrel as it rotates.

In practice, the ultraviolet radiation source 32 may be arranged on a reciprocating carriage which is independently or conjointly operated with the reciprocating carriage 24 comprising the resin bath 26.

FIG. 2 is a perspective view of a tubular article formed by the filament winding system shown in FIG. 1. The tube 40 features two separate layers of filament windings, a first layer 42 laid down on the mandrel, and a reverse lapped filament winding second layer 44. This filament wound article is formed on the mandrel and actinic radiation cured, subsequent to which the mandrel is detached from the winding machine, and the filament wound sheath is removed as the discrete product article shown in FIG. 2.

FIG. 3 is a perspective view of a filament winding system 50 which may be employed for making a solid fuel rocket motor including a substantially cylindrical solid fuel body 64.

The winding machine 50 comprises a frame 52 supported at one end by base 54 and at the other by a control module 56. The control module features a monitor 60 and control panel 62, whereby the winding operation may be controlled, with respect to the winding angle of the filaments wound on the solid fuel body 64, via control of the axes of motion, i.e., spindel, carriage, radial motion, and rotating eye, as conventionally controlled int eh filament winding art, to vary the orientation, relationship, and thickness of constituent fibers or rovings applied to the cylindrical body.

The solid fuel body 64 is mounted on a shaft 66, serving as a spindle, and a drive shaft 67 which is connected to drive motor 58 by suitable gear coupling or direct drive arrangement.

Filaments 72 are introduced to the feed canister 69 of the resin bath 70, the resin bath containing a resin composition according to the present invention comprising an actinic radiation curable first resin component, and a second ambient cure component. The resin bath vessel is mounted on a reciprocatable carriage 68 which is capable of movement in the longitudinal direction, radially, and in cross-carriage direction. The resin composition-impregnated filaments are dispensed as a roving 76 which is wound onto the solid fuel body 64 during its rotation in the direction indicated by arrow T.

FIG. 4 shows a perspective view, partially broken away, of the solid fuel rocket motor formed by the filament winding machine of FIG. 3. The solid fuel rocket motor 80 includes the substantially cylindrical solid fuel body 64 encases in a filament wound sheathing 82 which may comprise a plurality of separate winding layers as shown.

FIG. 5 is a simplified schematic depiction of a pultrusion process system 90 for producing pultruded filament articles in accordance with the present invention. As shown a plurality of filaments 92 are drawn in the direction indicated by arrow F through a feed plate 94, which is provided with suitable openings to accommodate the passage of the respective filaments therethrough. The filaments next are drawn through the resin bath 96 containing resin composition 98, e.g., a resin composition comprising an actinic radiation curable acrylate first resin component and an ambient or elevated temperature curing epoxy resin as the second resin component. The resulting resin-impregnated fibers 100 are then drawn through a squeeze-off bushing, or preformer, 102, which imparts the desired cross-sectional shape to the filament array, in conjunction with the die 110. Interposed between the preformer and the die is an ultraviolet curing oven 106 which operates to impinge actinic radiation of the desired wavelength onto the shaped filament array to produce a partially cured filament array 108 characterized by structural rigidity and handleability.

The die 110 may be heated in the event that a thermally cured second resin component is employed, or may be associated with curing means which are effective to cure the second resin component and produce the final, fully cured product article 112, which is drawn by suitable puller or other pultrusion drawing apparatus (not shown) in the direction indicated by arrow P.

As a result of the use of an actinic radiation curable first resin component in the compositions of the invention, the pultrusion process may be operated at substantially higher linear rates than has heretofor been possible. As indicated hereinabove, conventional pultrusion systems utilize a drawing rate (linear travel velocity) of about 0.5 to 2 feet per minute, with a heat cure retention time of approximately 10 minutes. The corresponding pultrusion process system of the present invention is able to achieve linear speeds in the process system of 5-6 feet per minute, with a UV curing time of 10 seconds.

As a result, the processing rate, and product volume produced, are substantially increased when pultrusion is conducted with the resin compositions comprising an actinic radiation curable first resin component, in accordance with the present invention.

The features and advantages of the invention are more fully shown hereinafter with respect to the following non-limiting examples, wherein all parts and percentages are by weight, unless otherwise expressly stated.

EXAMPLE I

One liter of Part A (See Table 1) was mixed with one liter of Part B (Table 1) to produce a liquid with a viscosity of 1200 cps. This liquid was then poured into the resin bath of a type shown in FIG. 1. An ASTM standard bottle was then wound with graphite fiber (fiber T40 from AMOCO) impregnated with the resin mixture. The resin was immobilized on the bottle during the winding by irradiation with ultraviolet radiation (365 n, 70,000 microwatts per square centimeter). Polar and hoop wraps were completed in two hours after which the bottle was rotated under the UV source for a further 10 minutes. At this point the bottle had sufficient strength to be handled and the rotation was terminated. The viscosity of the resin in the bath had now risen to 2400 cps. Thus, without the UV immobilization the bottle would require rotation until at least the expiration of the pot life i.e., 24 hours. After four days the room temperature post-cure of the resin was completed as evidenced by a leveling off in the Shore D hardness of samples of the resin. Standard ASTM dog bones cast with the resin were tested indicating the cured resin to have the mechanical properties set out below.

| | |
|---|---|
| Tensile shear strength | 5500 psi |
| Modulus | 260,000 |
| % Elongation at the break | 3.0 |
| Shore D hardness | 86 |

Pressurization of the bottle established the burst strength at 2500 psi.

TABLE I

| | % Wt. |
|---|---|
| PART A | |
| Cycloaliphatic Bisepoxide A (Union Carbide Cyracure 6110) | 30.00 |
| Cycloaliphatic Bisepoxide B (Union Carbide Cyracure 6351) | 49.00 |
| dipentaerythritol monohydroxy pentaacrylate (Sartomer SR399) | 18.00 |
| Diethoxy acetophenone (Upjohn) | 3.0 |
| | 100 |
| PART B | |
| Liquid Anhydride Blend (Anhydrides and Chemicals ACDP-1) | 80 |
| 1,6-hexanediol diacrylate (Sartomer) | 20 |
| | 100 |

EXAMPLE II

One liter of Part A (See Table II) was mixed with one liter of Part B (Table II) to produce a resin mixture of less than 1500 cps viscosity. The resin was then poured into the resin bath of the type shown in FIG. 1 and an ASTM standard bottle wound as in Example 1. UV cure conditions were as for Example 1 and room temperature post curing was carried out for 10 days. The burst strength of the bottle was 2200 psi.

TABLE II

| | % Wt. |
|---|---|
| PART A | |
| Diglycidyl ether bisphenol A (Dow Der 331) | 75.0 |
| Dipentaerythritol monohydroxy pentaacrylate | 22.0 |
| 1-benzoyl cyclohexanol | 3.0 |
| | 100 |

TABLE II-continued

| | % Wt. |
|---|---|
| PART B | |
| Polypropyleneamine (Texaco Jeffamine D230) | 22.77 |
| Acrylated Urethane resin (Interez CMD 8850) | 53.55 |
| N-vinyl pyrrolidone (GAF) | 20.86 |
| 1-benzoylcyclohexanol | 2.32 |
| Transition metal chelators (Loctite Corp PM18, PM30) | 0.50 |
| | 100 |

EXAMPLE III

The suitability of resins for filament winding were evaluated by the following experiments. Table II below details the compositions for the four resins tested.

TABLE III

FILAMENT WINDING COMPOSITIONS

| | A | B | C | D |
|---|---|---|---|---|
| Part 1 | | | | |
| Diglycidyl ether bisphenol A | — | — | 75.3 | 75.3 |
| Cycloaliphatic bisepoxide A (Cyracure 6110) | 29.21 | 29.21 | — | — |
| Cycloaliphatic bisepoxide B (Cyracure 6351) | 48.69 | 48.69 | — | — |
| dipentaaerithritol-monohydroxy pentaacrylate | 18.50 | 18.50 | 21.0 | 21.0 |
| 1-benzoyl cyclohexanol | — | — | 3.0 | 3.0 |
| diethoxyacetophenone | 2.92 | 2.92 | — | — |
| Organic air release agent (BYK Mallinkrodt A501) | 0.49 | 0.49 | 0.50 | 0.50 |
| Pennco Black (Penn Color) | 0.19 | 0.19 | 0.2 | 0.20 |
| Part 2 | | | | |
| Polypropyleneamine (Texaco Jeffamine D230) | — | — | 22.73 | 100 |
| liquid anhydride blend (Anhydrides & Chemicals ACDP-1) | 80 | 80 | — | — |
| dipentaaerithritol-monohydroxy pentaacrylate | 20 | — | — | — |
| hexanediol diacrylate | — | 20 | — | — |
| aluminum oxide | — | — | 68.18 | — |
| C14 aliphatic diacrylate (Chemlink C2000 Sartomer) | — | — | 9.09 | — |
| MIX RATIO | 1:1 | 1:1 | 1:1 | 4 pt Part 1 1 pt Part 2 |

TABLE IV

MECHANICAL PROPERTIES FILAMENT WINDING COMPOSITIONS

| | TEST | | |
|---|---|---|---|
| Composition | X | Y | Z |
| A | 108 pounds | 1252 psi | 5600 psi |
| B | 137 pounds | 850 psi | — |
| C | 148 pounds | 1526 psi | 3000 psi |
| D | 157 pounds | 1441 psi | — |
| Dry Tow | 63 pounds | — | — |

Test X

Dry tows of graphite fiber were impregnated with the resins from Table III (AMOCO Graphite T40) and irradiated with ultraviolet radiation, 100,000 microwatts per square centimeter/10 seconds/365 nm/360° irradiation. The specimens prepared as per ASTM strand test D3039 were then left to room temperature age for seven days. Table IV above details the results of tensile testing the impregnated tows and compares these results with values for dry tows. This quantifies the ability of the resin to transfer load in shear about discontinuities (voids, fiber breaks, etc.) to other nearby fibers.

Test Y

This test evaluates the reinforcing effect of the resin by using a modification of ASTM D1002. Dry tows of graphite fiber were impregnated with the resins from Table III. The resin impregnated tow was wound circumferentially around the one inch overlap area of individual 4×1 inch steel lapshear specimens. The fiber wound lap specimens were then irradiated for 10 seconds/100,000 microwatts per square centimeter ultraviolet radiation/365 nm wavelength. Liquid resin was then applied to the bond area of each lapshear, and the lapshears mated and clamped in a standard D1002 configuration. After one week room temperature aging the lap specimens were tested for tensile shear strength and these results are reported also in Table IV above.

Test Z

Tensile strength of resins A and C were determined as per ASTM D638 and are reported in Table IV above. Cure conditions for the polymers were 10 seconds irradiation at 100,000 microwatts per square centimeters/365 nm followed by 15 minutes heat cure at 250° F. to ensure complete polymerization.

Other suitable resin compositions which may be potentially useful in the broad practice of the present invention include the formulations set out in Tables I–VII of aforementioned U.S. patent application Ser. No. 882,670.

In addition to solid fuel bodies, the materials which can be filament wound as integral core bodies of filament articles in accordance with the present invention include bodies formed of materials such as glasses, graphite, boron, Kevlar ®, polyacetal, and more generally, wood, metals, natural and synthetic polymers, elastomers, etc.

Further, while the invention has been described with reference to specific embodiments, it will be apparent that numerous variations, modifications, and embodiments of the invention are possible, and accordingly all such variations, modifications, and embodiments are to be regarded as being within the spirit and scope of the present invention as claimed.

What is claimed is:

1. A solid fuel rocket motor precursor article, comprising a solid fuel body in a filament-wound fiber-resin composite casing, said casing being formed by filament winding on said solid fuel body of a continuous filament impregnated with a resin composition comprising an actinic radiation-curable first resin component and an ambient temperature curable second resin component, wherein the actinic radiation-curable component is present in an immobilizingly effective amount for said composition prior to ambient temperature curing of the second resin component, and wherein said resin composition has been subjected to actinic radiation curingly effective for the first resin component and is ambient temperature curable in respect of the second resin component.

2. A solid fuel rocket motor precursor article according to claim 1, wherein the actinic radiation-curable first resin component is selected from the group consisting of (meth)acrylic resins, vinyl monomers, unsaturated polyesters solubilized in vinyl monomers, and epoxy resins.

3. A solid fuel rocket motor precursor article according to claim 1, wherein said actinic radiation-curable first resin component is a (meth)acrylic resin.

4. A solid fuel rocket motor precursor article according to claim 1, wherein the ambient temperature curable second resin component is selected from the group consisting of epoxy resins, silicones, and urethanes.

5. A solid fuel rocket motor precursor article according to claim 1, wherein said ambient temperature curable second resin component is an epoxy resin.

6. A solid fuel rocket motor precursor article according to claim 1, wherein said solid fuel body has a substantially cylindrical shape, and said filament-wound casing comprises substantially helically wound windings on said solid fuel body.

7. A solid fuel rocket motor precursor article according to claim 6, comprising a plurality of circumferentially overlapping helically wound filament layers.

8. A solid fuel rocket motor precursor article according to claim 1, wherein the first resin component is present at a concentration of from about 5% to 20% by weight, based on the total weight of the first and second resin components in the composition.

9. A solid fuel rocket motor precursor article according to claim 1, wherein the concentration of the first resin component is from about 5 to 10% by weight, based on the weight of the first and second resin components in the resin composition.

10. A solid fuel rocket motor precursor article according to claim 1, wherein the first resin component is UV radiation-curable.

11. A solid fuel rocket motor precursor article, comprising a substantially cylindrical solid fuel rocket body in a filament-wound fiber-resin composite casing formed thereon, said fiber-resin composite including continuous filament in a resin matrix comprising an actinic radiation-cured first resin component and an ambient temperature-curable second resin component.

* * * * *